United States Patent
Brugnara et al.

(10) Patent No.: US 12,195,847 B2
(45) Date of Patent: Jan. 14, 2025

(54) MULTILAYER SYSTEM, COMPONENT, AND METHOD FOR PRODUCING SUCH A MULTILAYER SYSTEM OR COMPONENT

(71) Applicant: Schaeffler Technologies AG & Co. KG, Herzogenaurach (DE)

(72) Inventors: Ricardo Henrique Brugnara, Hessdorf (DE); Nazlim Bagcivan, Nuremberg (DE); Edgar Schulz, Langensendelbach (DE); Markus Schmalwasser, Fürth (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 0 days.

(21) Appl. No.: 18/030,526

(22) PCT Filed: Sep. 20, 2021

(86) PCT No.: PCT/DE2021/100764
§ 371 (c)(1),
(2) Date: Apr. 6, 2023

(87) PCT Pub. No.: WO2022/073541
PCT Pub. Date: Apr. 14, 2022

(65) Prior Publication Data
US 2023/0407464 A1    Dec. 21, 2023

(30) Foreign Application Priority Data

Oct. 7, 2020 (DE) .................. 102020126195.0
Sep. 15, 2021 (DE) .................. 102021123832.3

(51) Int. Cl.
*C23C 16/34* (2006.01)
*C23C 16/06* (2006.01)
(Continued)

(52) U.S. Cl.
CPC ............ *C23C 16/345* (2013.01); *C23C 16/06* (2013.01); *C23C 16/26* (2013.01); *C23C 16/44* (2013.01)

(58) Field of Classification Search
None
See application file for complete search history.

(56) References Cited

U.S. PATENT DOCUMENTS

| | | | |
|---|---|---|---|
| 2009/0075114 A1* | 3/2009 | Hovsepian | C23C 28/34 428/650 |
| 2013/0209767 A1* | 8/2013 | Kolev | C23C 14/0057 427/255.28 |

FOREIGN PATENT DOCUMENTS

| | | |
|---|---|---|
| DE | 102004044919 | 3/2006 |
| DE | 102013209030 | 12/2014 |
| JP | 2013167012 A | 8/2013 |

OTHER PUBLICATIONS

Hoche Holger et al. "Development of new PVD coatings for magnesium alloys with improved corrosion properties", Surface and Coatings Technology, vol. 259, Apr. 26, 2014, pp. 102-108 DOI: 10.1016/J.SURFCOAT.2014.04.038 ISSN: 0257-8972, XP029097831 paragraph [0004], (Apr. 26, 2014).

(Continued)

*Primary Examiner* — Seth Dumbris
(74) *Attorney, Agent, or Firm* — Volpe Koenig

(57) ABSTRACT

A multilayer system having at least one anticorrosion layer and a wear protection layer, wherein the anticorrosion layer is formed by a metal nitride or a metal carbonitride which contains at least titanium and magnesium as the metal, wherein the metal nitride or the metal carbonitride further includes at least one rare earth metal, and the wear protection layer is formed by at least one diamond-like metal-free carbon layer. A component having such a multilayer system (Continued)

and a method for producing the multilayer system or the component are also provided.

11 Claims, 2 Drawing Sheets

(51) Int. Cl.
*C23C 16/26* (2006.01)
*C23C 16/44* (2006.01)

(56) References Cited

OTHER PUBLICATIONS

Hoche Holger et al. "Establishing PVD-coatings for the corrosion protection of mild steel substrates for complex tribological and corrosive stresses", Surface and Coatings Technology, Elsevier, NL, vol. 376, Jun. 6, 2018, pp. 74-83, [retrieved on Jun. 6, 2018] DOI: 10.1016/ISURFCOAT.2018.06.007 ISSN: 0257-8972. XP085818359 paragraph [0004], (Jun. 6, 2018).

* cited by examiner

MULTILAYER SYSTEM, COMPONENT, AND METHOD FOR PRODUCING SUCH A MULTILAYER SYSTEM OR COMPONENT

CROSS-REFERENCE TO RELATED APPLICATIONS

This application is the U.S. National Phase of PCT Appln. No. PCT/DE2021/100764, filed Sep. 20, 2021, which claims the benefit of German Patent Appln. No. 102020126195.0, filed Oct. 7, 2020, and German Patent Appln. No. 102021123832.3, filed Sep. 15 2021, the entire disclosures of which are incorporated by reference herein.

TECHNICAL FIELD

The disclosure relates to a multilayer system comprising at least one anticorrosion layer and one wear protection layer. The disclosure also relates to a component comprising a metallic substrate having a surface and a multilayer system. Furthermore, the disclosure relates to a method for producing such a multilayer system or component.

BACKGROUND

Hard chrome layers are currently used in the automotive industry as anticorrosion and wear protection layers to protect the steels used from corrosion and mechanical wear. Such hard chrome layers are usually produced using electrolyte baths containing chromium(VI), which are now classified as questionable from an environmental point of view and their use is increasingly subject to legislative restrictions. Accordingly, there is a need to replace the hard chrome layer with a coating that can be produced in a more environmentally friendly manner.

Multilayer systems comprising at least one anticorrosion layer and one wear protection layer are already known from DE 10 2013 209 030 A1. A corrosion protection for a metallic component is described therein, which comprises at least one wear protection layer in the form of a layer formed chemically, galvanically or by means of PVD/PACVD processes, which is formed on the metallic component. At least one anticorrosion layer, which is formed by means of an ALD (=atomic layer deposition) process, is arranged on the wear protection layer. However, the ALD process is not very suitable for mass use in the automotive industry.

DE 10 2004 044 919 A describes a decorative coating for protecting substrates against corrosion, wear and oxidation based on refractory metal magnesium nitrides and methods for producing it.

SUMMARY

It is the object of the disclosure to provide an alternative multilayer system that offers even more reliable corrosion and wear protection and can be manufactured in large quantities. Furthermore, it is the object of the disclosure to provide a component with such a multilayer system and to disclose a method for producing such a multilayer system or component.

The object is achieved for a multilayer system, comprising at least one anticorrosion layer and a wear protection layer, in that the anticorrosion layer is formed by a metal nitride or a metal carbonitride which contains at least titanium and magnesium as the metal, wherein the metal nitride or the metal carbonitride further comprises at least one rare earth metal, and the wear protection layer is formed by at least one diamond-like metal-free carbon layer.

The multilayer system ensures effective corrosion and wear protection for metallic substrates. It can withstand both mechanical and corrosive attack due to the wear protection layer directly or indirectly protecting the anticorrosion layer and bearing the mechanical load. The wear protection layer preferably has friction-reducing properties with respect to a contact partner in frictional contact therewith in a tribological system.

The multilayer system can also be produced in high quantities at low production costs, making it suitable for use in the automotive industry.

The anticorrosion layer in particular has 10 to 40 at % titanium and/or 15 to 50 at % magnesium. The concentration of the at least one rare earth metal in the anticorrosion layer is preferably in the range from 0.1 to 15 at %.

Preferably, the metal nitride or the metal carbonitride for forming the anticorrosion layer is further formed comprising at least one metal selected from the group consisting of aluminum, chromium, zirconium, hafnium. Their concentration in the anticorrosion layer is preferably in the range from 10 to 40 at %.

Particularly preferably, the metal nitride or metal carbonitride comprises gadolinium or cerium or lanthanum as the rare earth metal, or a mixture of two or three of said elements.

In particular, the anticorrosion layer is formed comprising TiMgGdN or TiMgGdCN or TiMgCeN or TiMgCeCN or TiMgLaN or TiMgLaCN.

Anticorrosion layers and their corrosion behavior based on metal nitrides such as TiMgREN (RE=rare earth) have been described in the publication "Corrosion and wear protection of mild steel substrates by innovative PVD coatings", Holger Hoche, Casper Pusch, Matthias Oechsner, Surface & Coatings Technology 391 (2020), see: https://doi.org/10.1016/j.surfcoat.2020 125659

It has proved advantageous if the anticorrosion layer is adjacent to a metallic adhesion-promoting layer on its side facing away from the wear protection layer. In particular, the metallic adhesion-promoting layer is formed of chromium or titanium or zirconium or magnesium or gadolinium or a mixture of two or three of said metals. The adhesion-promoting layer serves to improve the mechanical bonding of the multilayer system to a metallic substrate.

The anticorrosion layer is preferably adjacent to an intermediate layer on its side facing the wear protection layer, which intermediate layer is formed from a silicon-doped metal nitride or a metal carbonitride, in particular a silicon-doped metal carbonitride. The intermediate layer serves to improve the mechanical bonding of the anticorrosion layer to the wear protection layer.

The wear protection layer in the form of at least one diamond-like metal-free carbon layer (=DLC—diamond-like coating) preferably comprises at least one layer of the type a-C or a-C:H or ta-C or ta-C:Si or ta-C:H:O:Si or a-C:H:Si or a-C:H:O:Si or a-C:H:N or a combination of at least two such carbon layers. Several carbon layers of the same composition can be formed on top of one another, or carbon layers of different compositions can alternate or follow one another to form a wear protection layer.

The anticorrosion layer preferably has a thickness in the range from 0.5 to 10 μm, in particular in the range from 0.5 to 5 μm. The wear protection layer preferably has a thickness in the range from 0.1 to 10 μm, in particular in the range from 0.1 to 5 μm.

The object is further achieved by a component comprising a metallic substrate with a surface and a multilayer system, wherein the multilayer system is formed at least partially on the surface of the substrate in such a manner that the wear protection layer forms a cover layer facing away from the substrate. Starting from the metallic substrate, the order would thus be:
   optional metallic adhesion-promoting layer
   anticorrosion layer
   optional intermediate layer
   wear protection layer (=cover layer)

In particular, the metallic substrate is formed of steel. The steel grades 100Cr6, 42CrMo4 or 16MnCr5 are particularly preferred in this regard.

The wear protection layer preferably has friction-reducing properties with respect to a contact partner in frictional contact therewith.

The following multilayer systems on metallic substrates, in particular steel, are particularly preferred and are mentioned here only by way of example:

Multilayer System 1:
   Adhesion-promoting layer: none
   Anticorrosion layer: TiMgGdN
   Intermediate layer: none
   Wear protection layer: a-C:H
Multilayer System 2:
   Adhesion-promoting layer: none
   Anticorrosion layer: TiMgGdN
   Intermediate layer: none
   Wear protection layer: a-C:H:Si
Multilayer System 3:
   Adhesion-promoting layer: TiMg
   Anticorrosion layer: TiMgGdN
   Intermediate layer: none
   Wear protection layer: a-C:H
Multilayer System 4:
   Adhesion-promoting layer: titanium
   Anticorrosion layer: TiMgGdN
   Intermediate layer: TiSiN
   Wear protection layer: a-C:H:Si
Multilayer System 5:
   Adhesion-promoting layer: titanium
   Anticorrosion layer: TiMgCrGdN
   Intermediate layer: CrSiN
   Wear protection layer: a-C:H:Si
Multilayer System 6:
   Adhesion-promoting layer: none
   Anticorrosion layer: TiMgGdCN
   Intermediate layer: none
   Wear protection layer: a-C:H:Si
Multilayer System 7:
   Adhesion-promoting layer: TiMg
   Anticorrosion layer: TiMgGdCN
   Intermediate layer: none
   Wear protection layer: a-C:H:Si
Multilayer System 8:
   Adhesion-promoting layer: TiMg
   Anticorrosion layer: TiMgLaCN or TiMgCeCN or TiMgLaN or TiMgCeN
   Intermediate layer: none
   Wear protection layer: a-C:H:Si
Multilayer System 9:
   Adhesion-promoting layer: TiMgGd
   Anticorrosion layer: TiMgGdN
   Intermediate layer: none
   Wear protection layer: at least one layer of the type a-C:H and/or a-C:H:Si
Multilayer System 10:
   Adhesion-promoting layer: TiMgGd
   Anticorrosion layer 1: TiMgGdN
   Anticorrosion layer 2: TiMgGdCN
   Intermediate layer: none
   Wear protection layer: at least one layer of the type a-C:H and/or a-C:H:Si
Multilayer System 11:
   Adhesion-promoting layer: TiMgGd
   Anticorrosion layer: TiMgGdCN
   Intermediate layer: none
   Wear protection layer: at least one layer of the type a-C:H and/or a-C:H:Si
Multilayer System 12:
   Adhesion-promoting layer: TiMgGd
   Anticorrosion layer: TiMgGdCN
   Intermediate layer: none
   Wear protection layer: at least one layer of the type ta-C:Si and/or ta-C:H:O:Si
Multilayer System 13:
   Adhesion-promoting layer: TiMgGd
   Anticorrosion layer 1: TiMgGdN
   Anticorrosion layer 2: TiMgGdCN
   Intermediate layer: TiCN or TiSiCN
   Wear protection layer: at least one layer of the type ta-C:Si and/or ta-C:H:O:Si The component according to the disclosure is in particular a rolling bearing component or a sliding bearing component or components used in tribological contact in connection with corrosive media. In particular, water-based lubricants, aqueous media and hydrocarbon-based lubricants aged in operation are considered corrosive media here.

The object is further achieved by a method for producing a multilayer system according to the disclosure or a component according to the disclosure, wherein the multilayer system is formed by means of a PVD process and/or a PACVD process. These methods are cost-effective for use in mass production, also in the automotive environment.

BRIEF DESCRIPTION OF THE DRAWINGS

FIG. 1 shows a first multilayer system comprising an anticorrosion layer and a wear protection layer;

FIG. 2 shows a second multilayer system comprising an anti-corrosion layer, an intermediate layer and a wear protection layer;

FIG. 3 shows a third multilayer system comprising an adhesion-promoting layer, an anticorrosion layer, an intermediate layer, and a wear protection layer FIG. 4 shows a fourth multilayer system comprising an adhesion-promoting layer, an anticorrosion layer and a wear protection layer;

FIG. 5 shows a component with a multilayer system according to FIG. 3; and

FIG. 6 shows a component in the form of a rolling bearing ring.

DETAILED DESCRIPTION

Figure 1:
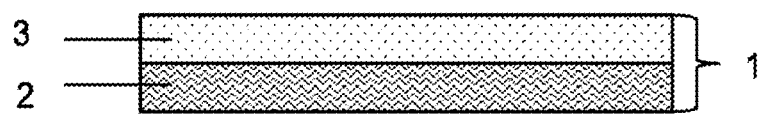
FIGS. 1 to 6 are intended to explain the disclosure by way of example. In the figures.

FIG. 1 shows a first multilayer system 1 in a sectional view perpendicular to the layer plane comprising an anti-corrosion layer 2 and a wear protection layer 3. The anti-corrosion layer 2 is formed by a metal nitride or a metal carbonitride which contains at least titanium and magnesium as the metal, wherein the metal nitride or the metal carbonitride further comprises at least one rare earth metal. The wear protection layer 3 is formed by at least one diamond-like metal-free carbon layer (DLC).

Figure 2:
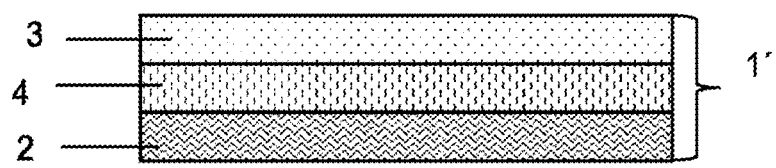

FIG. 2 shows a second multilayer system 1' in a sectional view perpendicular to the layer plane comprising an anticorrosion layer 2, an intermediate layer 4 and a wear protection layer 3. The anticorrosion layer 2 is formed by a metal nitride or a metal carbonitride which contains at least titanium and magnesium as the metal, wherein the metal nitride or the metal carbonitride further comprises at least one rare earth metal. The wear protection layer 3 is formed by at least one diamond-like metal-free carbon layer (DLC). The intermediate layer 4 is formed of a silicon-doped metal nitride or a metal carbonitride, in particular a silicon-doped metal carbonitride.

Figure 3:
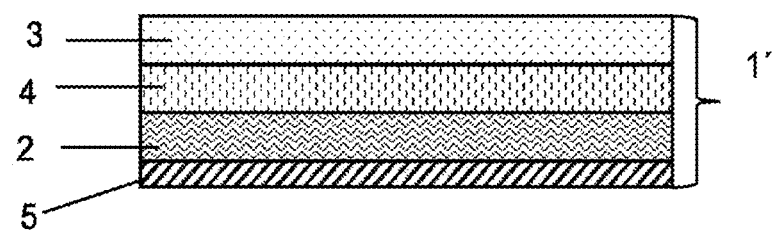

FIG. 3 shows a third multilayer system 1" in a sectional view perpendicular to the layer plane comprising an adhesion-promoting layer 5, an anticorrosion layer 2, an intermediate layer 4 and a wear protection layer 3. The anticorrosion layer 2 is formed by a metal nitride or a metal carbonitride which contains at least titanium and magnesium as the metal, wherein the metal nitride or the metal carbonitride further comprises at least one rare earth metal. The wear protection layer 3 is formed by at least one diamond-like metal-free carbon layer (DLC). The intermediate layer 4 is formed of a silicon-doped metal nitride or a metal carbonitride, in particular a silicon-doped metal carbonitride. The metallic adhesion-promoting layer 5 is preferably formed of chromium or titanium or zirconium or magnesium or gadolinium or a mixture of two or three of said metals. In particular, the adhesion-promoting layer 5 is formed of TiMg here.

Figure 4:
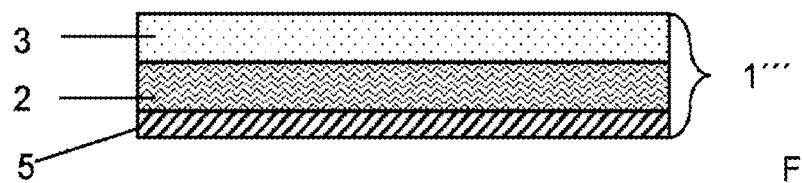

FIG. 4 shows a fourth multilayer system 1''' in a sectional view perpendicular to the layer plane comprising an adhesion-promoting layer 5, an anticorrosion layer 2 and a wear protection layer 3. The anticorrosion layer 2 is formed by a metal nitride or a metal carbonitride which contains at least titanium and magnesium as the metal, wherein the metal nitride or the metal carbonitride further comprises at least one rare earth metal. The wear protection layer 3 is formed by at least one diamond-like metal-free carbon layer (DLC). The metallic adhesion-promoting layer 5 is preferably formed of chromium or titanium or zirconium or magnesium or gadolinium or a mixture of two or three of said metals.

Figure 5:
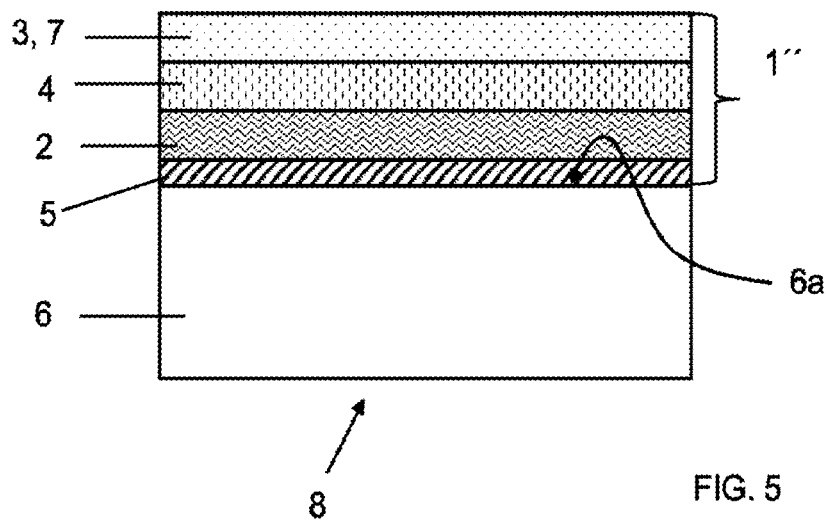

FIG. 5 shows a component 8 in a sectional view perpendicular to the layer plane of the multilayer system comprising a metallic substrate 6 with a surface 6a and the third multilayer system 1" according to FIG. 3, wherein the third multilayer system 1" is formed partially on the surface 6a of the substrate 6 in such a manner that the wear protection layer 3 forms a cover layer 7 facing away from the substrate 6.

Figure 6:
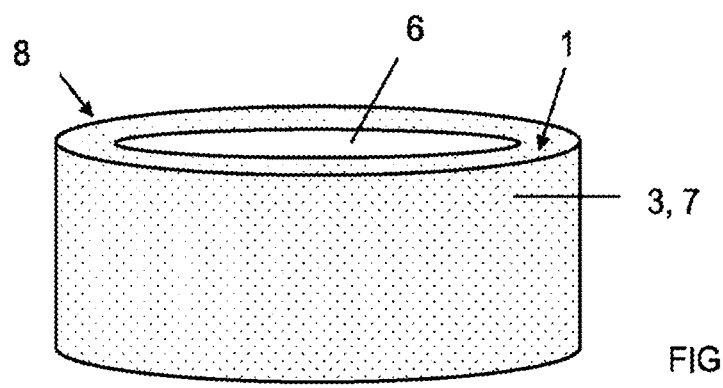

FIG. 6 shows a component 8 in the form of a rolling bearing ring in a three-dimensional view. The component 8 comprises an annular metallic substrate 6, which is covered on its cylindrical lateral surface and its end faces with a multilayer system 1 according to FIG. 1. Alternatively, of course, other multilayer systems according to the disclosure can also be used in this regard.

Furthermore, the multilayer system can cover a substrate completely or only superficially in certain regions, depending on the corrosive attack present and the specific wear conditions.

LIST OF REFERENCE SYMBOLS

1, 1", 1", 1''' Multilayer system
2 Anticorrosion layer
3 Wear protection layer
4 Intermediate layer
5 Adhesion-promoting layer
6 Substrate
6a Surface
7 Cover layer
8 Component

The invention claimed is:

1. A multilayer system comprising:
   at least one anticorrosion layer and a wear protection layer;
   the anticorrosion layer is formed by a metal nitride or a metal carbonitride which contains at least titanium and magnesium as a metal;
   the metal nitride or the metal carbonitride further comprises at least one rare earth metal; and
   the wear protection layer is formed by at least one diamond-like metal-free carbon layer;
   wherein the anticorrosion layer is adjacent to an intermediate layer on a side thereof facing the wear protection layer, such that the intermediate layer is positioned between the anticorrosion layer and the wear protection layer, and the intermediate layer is formed of a silicon-doped metal nitride or a silicon-doped metal carbonitride.

2. The multilayer system according to claim 1, wherein the metal nitride or the metal carbonitride is further formed comprising at least one metal selected from the group consisting of aluminum, chromium, zirconium, or hafnium.

3. The multilayer system according to claim 1, wherein the at least one rare earth metal comprises at least one of gadolinium, cerium, or lanthanum.

4. The multilayer system according to claim 1, wherein the anticorrosion layer is formed comprising TiMgGdN or TiMgGdCN or TiMgCeN or TiMgCeCN or TiMgLaN or TiMgLaCN.

5. The multilayer system according to claim 1, wherein the anticorrosion layer is adjacent to a metallic adhesion-promoting layer on a side thereof facing away from the wear protection layer.

6. The multilayer system according to claim 5, wherein the metallic adhesion-promoting layer is formed of at least one of chromium, titanium, zirconium, magnesium, or gadolinium.

7. The multilayer system according to claim 1, wherein the wear protection layer comprises at least one diamond-like metal-free carbon layer of a type a-C or a-C: H or ta-C or ta-C: Si or ta-C:H:O:Si or a-C:H:Si or a-C:H:O:Si or a-C: H: N or a combination of at least two of these types.

8. The multilayer system according to claim 1, wherein the anticorrosion layer has a thickness in a range from 0.5 to 10 μm.

9. A component comprising a metallic substrate with a surface the multilayer system is according to claim 1 formed at least partially on the surface such that the wear protection layer forms a cover layer facing away from the metallic substrate.

10. The component according to claim 9, wherein the component comprises a rolling bearing component or a sliding bearing component or a component used in a tribological contact and further in contact with a corrosive medium.

11. The multilayer system of claim 1, wherein the wear protection layer has a thickness in the range from 0.1 to 10 μm.

\* \* \* \* \*